United States Patent
Muramatsu

(10) Patent No.: US 6,856,192 B2
(45) Date of Patent: Feb. 15, 2005

(54) CLASS-D AMPLIFIER OF BTL OUTPUT TYPE USING FILTER COIL AND LOW-PASS FILTER

(75) Inventor: Toshihiko Muramatsu, Iwata-gun (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 10/266,904

(22) Filed: Oct. 8, 2002

(65) Prior Publication Data

US 2003/0067349 A1 Apr. 10, 2003

(30) Foreign Application Priority Data

Oct. 10, 2001 (JP) ............................. P2001-313141

(51) Int. Cl.[7] ............................. H03F 3/38; H03F 3/217
(52) U.S. Cl. ..................................... 330/10; 330/207 A
(58) Field of Search ............................. 330/10, 68, 165, 330/195, 207 P, 251, 207 A; 336/184

(56) References Cited

U.S. PATENT DOCUMENTS

| | | | |
|---|---|---|---|
| 4,949,048 A | * | 8/1990 | Tokumo et al. ............ 330/10 |
| 5,113,145 A | * | 5/1992 | Ideler et al. ............ 330/251 |
| 6,160,461 A | | 12/2000 | Azuma et al. |
| 6,211,749 B1 | * | 4/2001 | Yuzurihara et al. ........ 333/17.3 |

FOREIGN PATENT DOCUMENTS

| | | |
|---|---|---|
| EP | 0967735 A1 | 12/1999 |
| GB | 2321807 A | 8/1998 |
| JP | S59-40713 | 3/1984 |

* cited by examiner

Primary Examiner—Steven J. Mottola
(74) Attorney, Agent, or Firm—Pillsbury Winthrop LLP

(57) ABSTRACT

A filter coil incorporates coils, each having the same inductance, which differ from each other in winding directions and are used for low-pass filters for eliminating carrier frequency components in BTL outputs of a class-D amplifier, which performs pulse-width modulation and amplification on input signals. A pair of coils can be arranged to adjoin together along axial directions thereof in a single package, or plural pairs of coils can be arranged to adjoin together in a single package with intervention of a magnetic shield therebetween. Alternatively, a pair of coils are wound about a single core along its axial direction with intervention of a magnetic shield therebetween. Thus, it is possible to effectively suppress inductive coupling between adjacent coils, and it is possible to realize reduction of installed areas of coils and reduction of the cost in manufacture of filter coils as well as prevention of unwanted radiation.

9 Claims, 8 Drawing Sheets

CLASS-D AMPLIFIER OF BTL OUTPUT TYPE USING FILTER COIL AND LOW-PASS FILTER

BACKGROUND OF THE INVENTION

1. Field of the Invention

This invention relates to class-D amplifiers of Bridged Tied Load (BTL) output types, which use filter coils and low-pass filters.

2. Description of the Related Art

FIG. 1 shows a typical example of a class-D amplifier of the BTL output type, which acts as an amplifier for driving speakers of two channels (i.e., right and left channels). That is, a class-D amplifier 1 of the BTL output type comprises pulse-width modulators 10 and 11 that produce pulse-width modulated (PWM) signals whose pulse widths match input signal levels, as well as drivers 12 to 15 for driving switching elements (not shown) such as metal-oxide semiconductor (MOS) transistors connected between the positive and negative voltage supplies (not shown).

There are provided two-channel speakers 20 and 21, which act as loads for the class-D amplifier 1. In addition, there are provided four low-pass filters (i.e., LC filters), each consisting of a pair of a capacitor (or capacitance) and an inductor (or inductance), respectively connected with output terminals of the class-D amplifier 1. That is, the speaker 20 is connected with the class-D amplifier 1 via first and second low-pass filters, wherein the first low-pass filter consisting of a capacitor C1 and an inductor L1 is connected with the output of the driver 12, and the second low-pass filter consisting of a capacitor C2 and an inductor L2 is connected with the output of the driver 13. In addition, the speaker 21 is connected with the class-D amplifier via third and fourth low-pass filters, wherein the third low-pass filter consisting of a capacitor C3 and an inductor L3 is connected with the output of the driver 14, and the fourth low-pass filter consisting of a capacitor C4 and an inductor L4 is connected with the output of the driver 15. All of these low-pass filters are provided to eliminate carrier frequency components included in the outputs of the class-D amplifier 1.

The drivers 12 and 14 receive pulse-width modulated (PWM) signals that are produced by the pulse-width modulators 10 and 11 respectively. In addition, the drivers 13 and 15 receive 'inverted' PWM signals output from the pulse-width modulators 10 and 11 respectively.

Therefore, each of the drivers 12 and 14 provides a positive or negative voltage in response to the polarity of the PWM signal, while each of the drivers 13 and 15 provides a positive or negative voltage in response to the polarity of the inverted PWM signal. Herein, the supply voltage (not shown) is inverted in polarity between a pair of the drivers 12 and 14, and a pair of the drivers 13 and 15. Thus, voltage pulses whose amplitude is double of the amplitude of the supply voltage are applied to the loads, namely, the speakers 20 and 21 respectively. In FIG. 1, arrow symbols represent flow directions of currents with respect to the loads 20 and 21 in response to the positive and negative polarities of the BTL outputs of the class-D amplifier 1.

The class-D amplifier 1 of the BTL output type uses two low-pass filters for eliminating carrier frequency components in the positive and negative outputs with respect to a single channel. Therefore, four low-pass filters are used in total with respect to two channels, that is, right and left channels.

In the aforementioned configuration, the class-D amplifier requires four filter coils independently for use in four low-pass filters for eliminating carrier frequency components when driving two-channel speakers.

It may be possible to use a common-mode coil, an example of which is shown in FIG. 8, wherein plural coils having the same winding direction are incorporated and arranged in such a way that external lines thereof are partially crossed with each other. Specifically, FIG. 8 shows two coils 80 and 81 having the same winding direction, which are incorporated and arranged adjacent to each other along axial directions thereof within a package 90.

In FIG. 8, ends of the coil 80 are connected with terminals 91 and 92, and ends of the coil 81 are connected with terminal 93 and 94. Lines 95 and 97 are wired in connection with the terminals 91 and 92 for the coil 80, and lines 96 and 98 are wired in connection with the terminals 93 and 94 for the coil 81. Herein, the lines 96 and 98 for the coil 81 are crossed with each other.

Since the aforementioned class-D amplifier requires four coils independently for use in the four low-pass filters for eliminating carrier frequency components of PWM signals corresponding to BTL outputs thereof, there are problems in that a considerable amount of the cost should be incurred for the provision of the four independent coils, which inevitably increase installed areas therefor.

In addition, flow directions of currents are reverse to each other between the positive polarity and negative polarity of the BTL outputs of the class-D amplifier. Therefore, in the package incorporating plural coils each having the same winding direction, it is necessary to cross external lines in the substrate wiring with respect to at least one coil in order to avoid occurrence of inductive coupling between the coils. This makes the substrate wiring to be complicated. In addition, it is difficult to provide countermeasures against unwanted radiation, which is troublesome.

SUMMARY OF THE INVENTION

It is an object of the invention to provide a filter coil and a low-pass filter for use in a class-D amplifier of a BTL output type, which realizes reduction of installed areas and reduction of the cost as well as prevention of occurrence of unwanted radiation.

A filter coil of this invention incorporates coils, each having the same inductance, which differ from each other in winding directions and are used for low-pass filters for eliminating carrier frequency components in BTL outputs of a class-D amplifier, which performs pulse-width modulation and amplification on input signals.

In the above, a pair of coils are arranged to adjoin together along axial directions thereof in a single package, or plural pairs of coils are arranged to adjoin together in a single package with intervention of a magnetic shield therebetween. Alternatively, a pair of coils are wound about a single core along its axial direction with intervention of a magnetic shield therebetween. Therefore, it is possible to realize cancellation of magnetic fluxes respectively produced by adjacent coils in the filter coil.

Thus, it is possible to effectively suppress inductive coupling between adjacent coils, and it is possible to realize reduction of installed areas of coils and reduction of the cost in manufacture of filter coils as well as prevention of unwanted radiation.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 2:
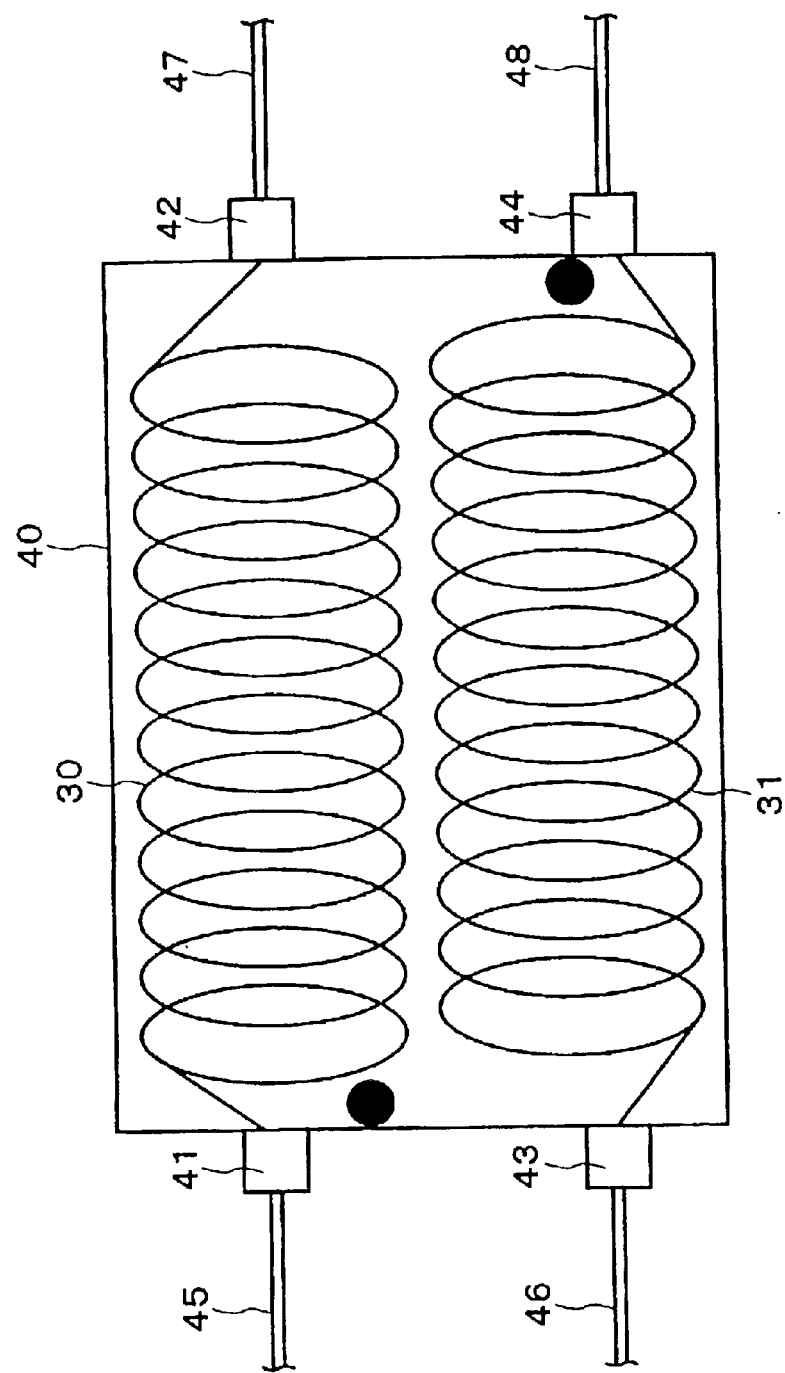
FIG. 2 diagrammatically shows the layout of coils incorporated in a filter coil for use in low-pass filters connected with BTL outputs of the class-D amplifier in accordance with a first embodiment of the invention.

FIG. 2 diagrammatically shows the overall configuration of a filter coil commonly for use in low-pass filters (i.e., LC filters) for eliminating carrier frequency components in Bridged Tied Load (BTL) outputs of a class-D amplifier in accordance with the first embodiment of the invention. The filter coil of the first embodiment is encapsulated in a single package 40, wherein two coils 30 and 31, each having the same inductance, which differ from each other in winding directions, are arranged to adjoin together along axial directions thereof.

For the sake of the convenience, only two coils 30 and 31 are illustrated in FIG. 2. Of course, this invention is not necessarily limited in the number of coils arranged in the filter coil. That is, it is possible to store plural pairs of coils, each having the same inductance, which differ from each other in winding directions.

In the case of FIG. 2, ends of the coil 30 are respectively connected with terminals 41 and 42, and ends of the coil 31 are respectively connected with terminals 43 and 44. The terminals 41 and 42 are respectively connected with lines 45 and 47, and the terminals 43 and 44 are respectively connected with lines 46 and 48.

Next, a description will be given with respect to the operation of the filter coil of FIG. 2 whose coils 30 and 31 are used as the aforementioned inductors L1 and L2 for use in the low-pass filters connected with the speaker 20 with reference to FIG. 3.

The line 45 is connected with the output of the driver (or BTL amplifier) 12, and the line 46 is connected with the output of the driver (or BTL amplifier) 13. In addition, the lines 47 and 48 are both connected with the speaker 30, which act as a load.

When the class-D amplifier 1 operates, the drivers 12 and 13 are provided with switching voltages in response to pulse-width modulated (PWM) signals, each having the same magnitude (or amplitude), which are inverse to each other in phases. Therefore, prescribed currents are caused to flow through the lines 45 and 46 respectively in directions X and Y, which are inverse to each other. Herein, the output signals of the drivers 12 and 13 are inverse to each other in such a way that when the output signal of the driver 12 has a positive polarity, the output signal of the driver 13 has a negative polarity. That is, when the driver 12 causes the prescribed current to flow in the direction X into the coil 30 towards the speaker 20, the other current is caused to flow in the direction Y via the speaker 20 and coil 31 towards the driver 13.

Figure 3:
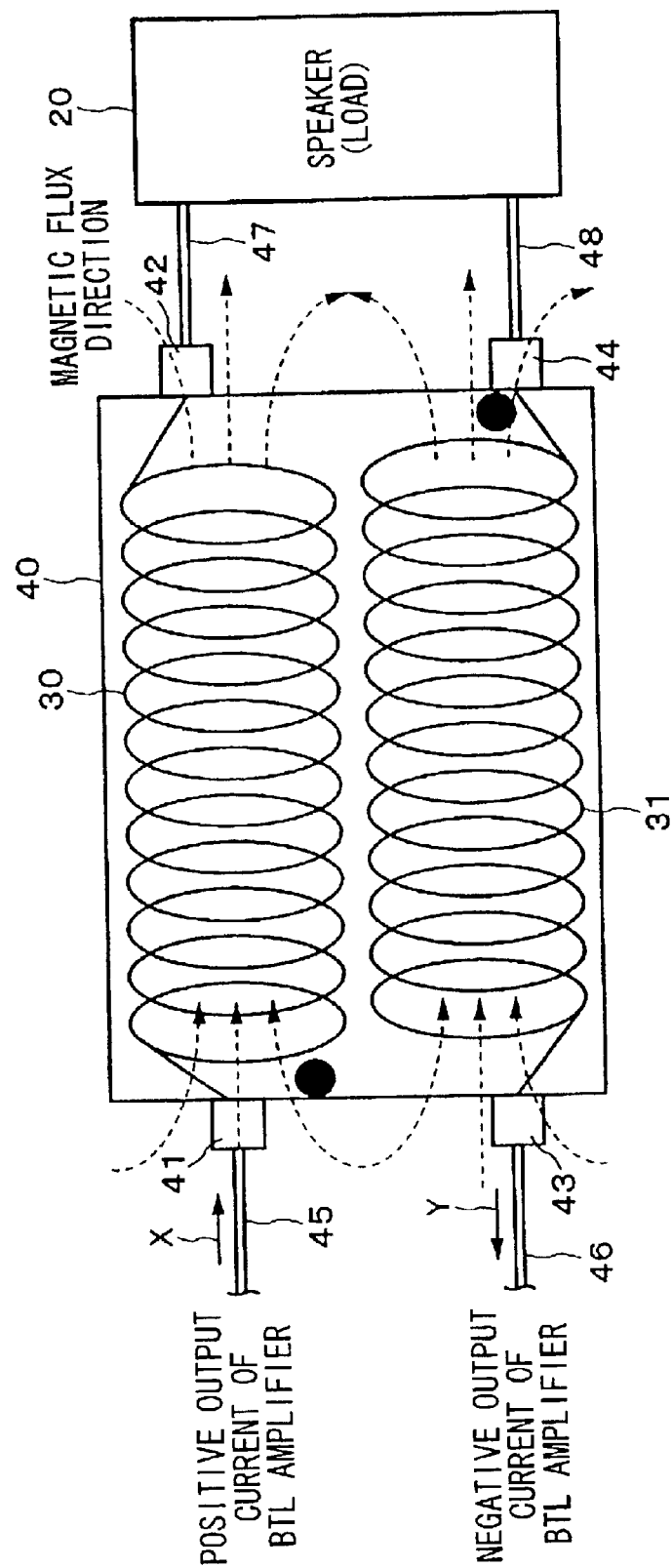
FIG. 3 diagrammatically shows current flows and magnetic fluxes caused by coils of the filter coil connected with a speaker.

FIG. 3 also shows directions of magnetic fluxes that occur due to the aforementioned currents flowing through the coils 30 and 31 by dotted lines and curves. That is, the magnetic fluxes induced respectively by the coils 30 and 31 mutually cancel each other. Therefore, it is possible to minimize the inductive coupling between the coils 30 and 31.

Next, a description will be given with respect to the operation of the aforementioned common-mode coil incorporating coils that are used as the inductors L1 and L2 for use in the low-pass filters connected with the speaker 20 with reference to FIG. 4. That is, the common-mode coil shown in FIG. 4 is accommodated in a package 60 incorporating two coils 50 and 51 having the same winding direction that are arranged to adjoin together.

Figure 4:
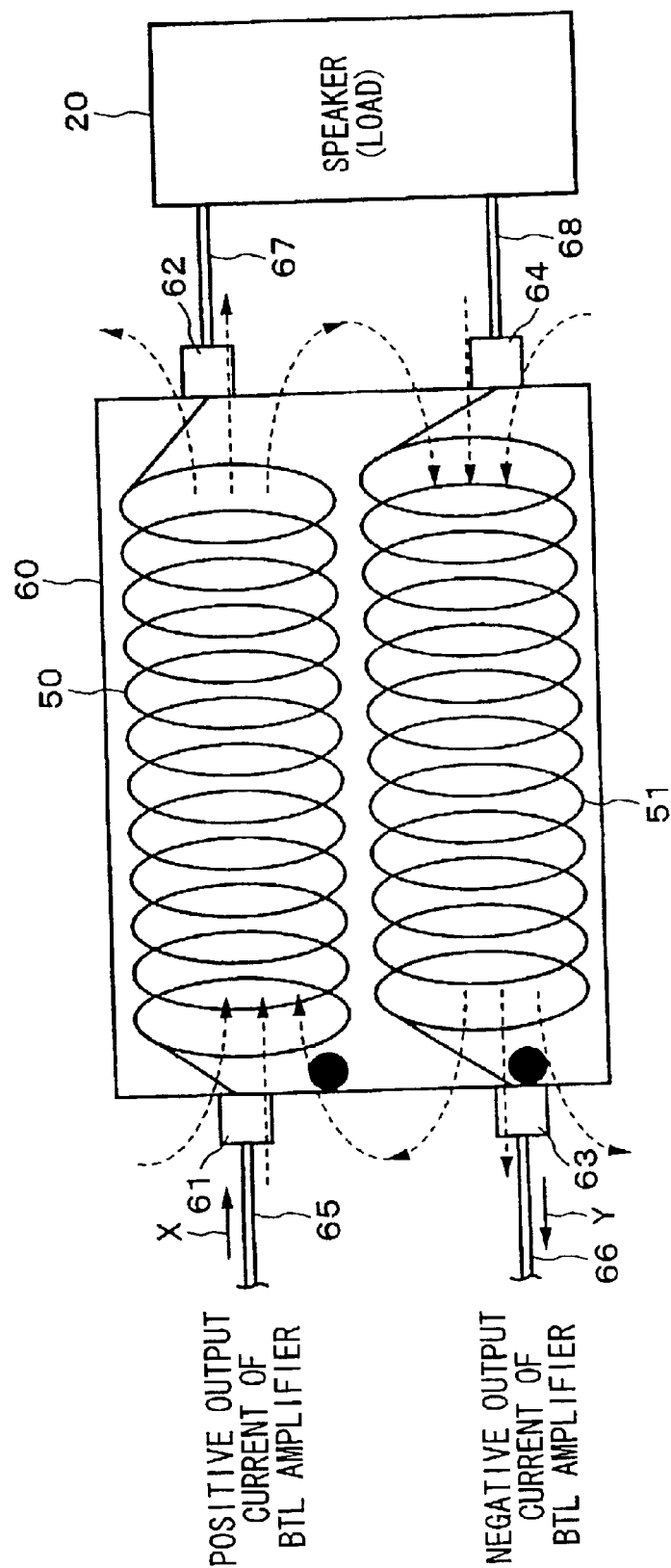
FIG. 4 diagrammatically shows current flows and magnetic fluxes caused by coils of the common-mode coil, which is connected with a speaker instead of the filter coil.

In FIG. 4, ends of the coil 50 are connected with terminals 61 and 62 respectively, and ends of the coil 51 are connected with terminals 63 and 64. In addition, the terminals 61 and 62 are connected with lines 65 and 67 respectively, and the terminals 63 and 64 are connected with lines 66 and 68 respectively.

When the aforementioned common-mode coil shown in FIG. 4 is connected between the class-D amplifier 1 and the speaker 20 instead of the aforementioned filter coil shown in FIG. 2 or FIG. 3, the driver 12 causes a current to flow through the coil 50 in the direction X towards the speaker 20, while the other current is caused to flow in the direction Y via the speaker 20 and coil 51 towards the driver 13. Herein, both the coils 50 and 51 have the same winding direction, the magnetic fluxes produced by the coils 50 and 51 are enhanced by each other, which inevitably causes inductive coupling.

Figure 8:
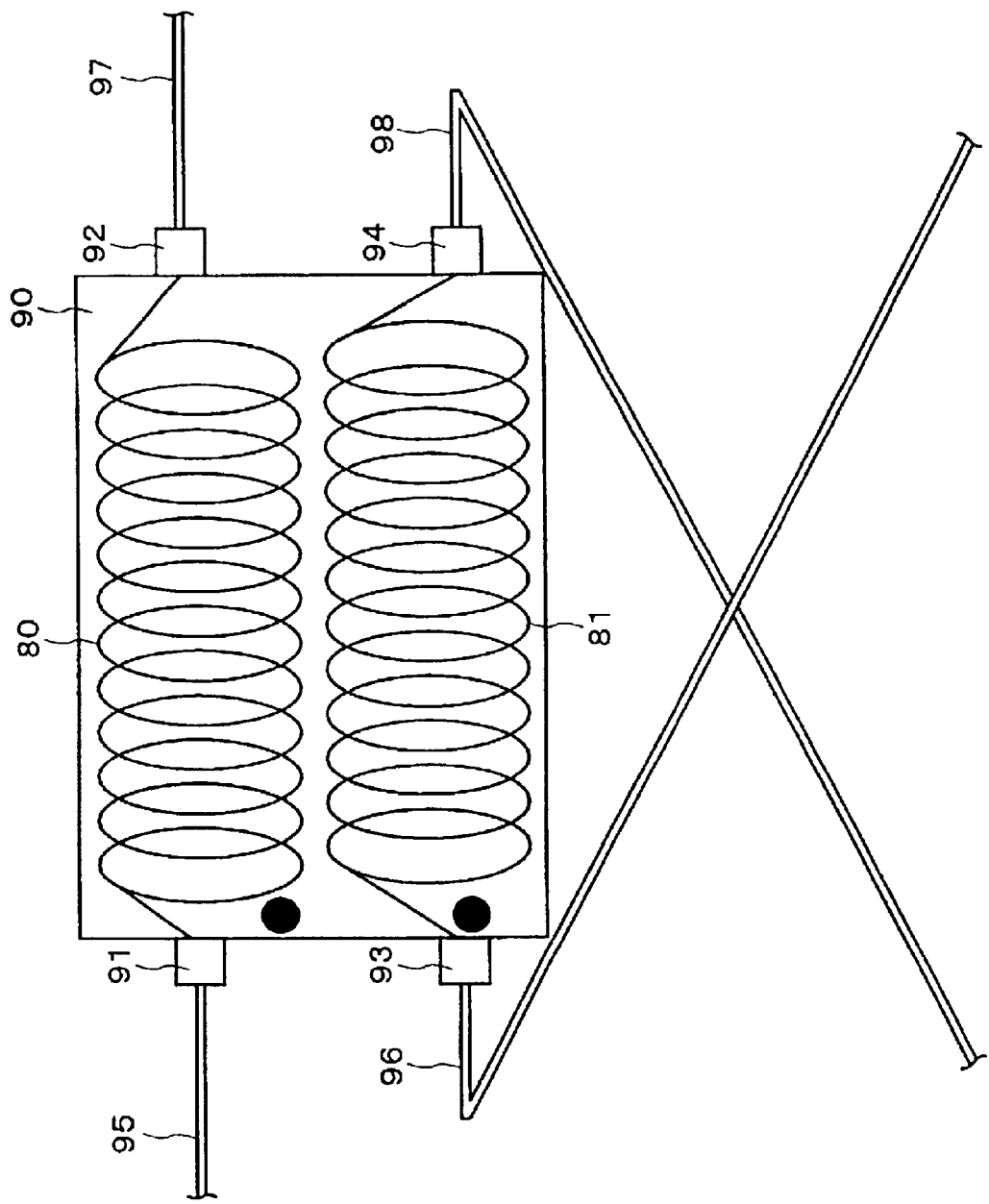
FIG. 8 diagrammatically shows the layout and line connection of coils incorporated in a common-mode coil for use in low-pass filters connected with BTL outputs of the class-D amplifier.

Therefore, when the common-mode coil is used as the inductors for use in low-pass filters for eliminating carrier frequency components in BTL outputs of the class-D amplifier, it is required that, as shown in FIG. 8, the driver 13 and speaker 20 be interconnected by crossing the line 66 of the coil 51 shown in FIG. 4 with the prescribed external line (not shown), by which the direction of the current flowing through the coil 51 are inverted, so as to invert the direction of the magnetic flux caused by the coil 51. For this reason, when the common-mode coil is used as coils for use in low-pass filters connected with BTL outputs of the class-D amplifier, there are several problems in that installed areas of coils are enlarged, the total cost of parts is increased, and difficult countermeasures against unwanted radiation should be required.

The filter coil of the first embodiment incorporates an even number of coils, each having the same inductance, which are arranged adjacent to each other along axial directions thereof, wherein the adjacent coils differ from each other in winding directions. That is, plural pairs of the aforementioned coils are arranged in a single package. Thus, it is possible to realize reduction of installed areas of coils and reduction of the cost in manufacture of filter coils incorporating coils for use in low-pass filters connected with BTL outputs of class-D amplifiers.

In the class-D amplifier of the BTL output type, the positive polarity output and the negative polarity output both have the same magnitude (or amplitude) but differ from each other in phases by 180°. Therefore, a pair of coils, which differ from each other in winding directions, respectively produce magnetic fluxes in opposite directions, causing cancellation of magnetic fluxes and preventing occurrence of inductive coupling therebetween. This eliminates the necessity of crossing external lines of coils in substrate wiring. That is, it is possible to effectively avoid occurrence of unwanted radiation, which may occur due to complication of substrate wiring.

Figure 5:
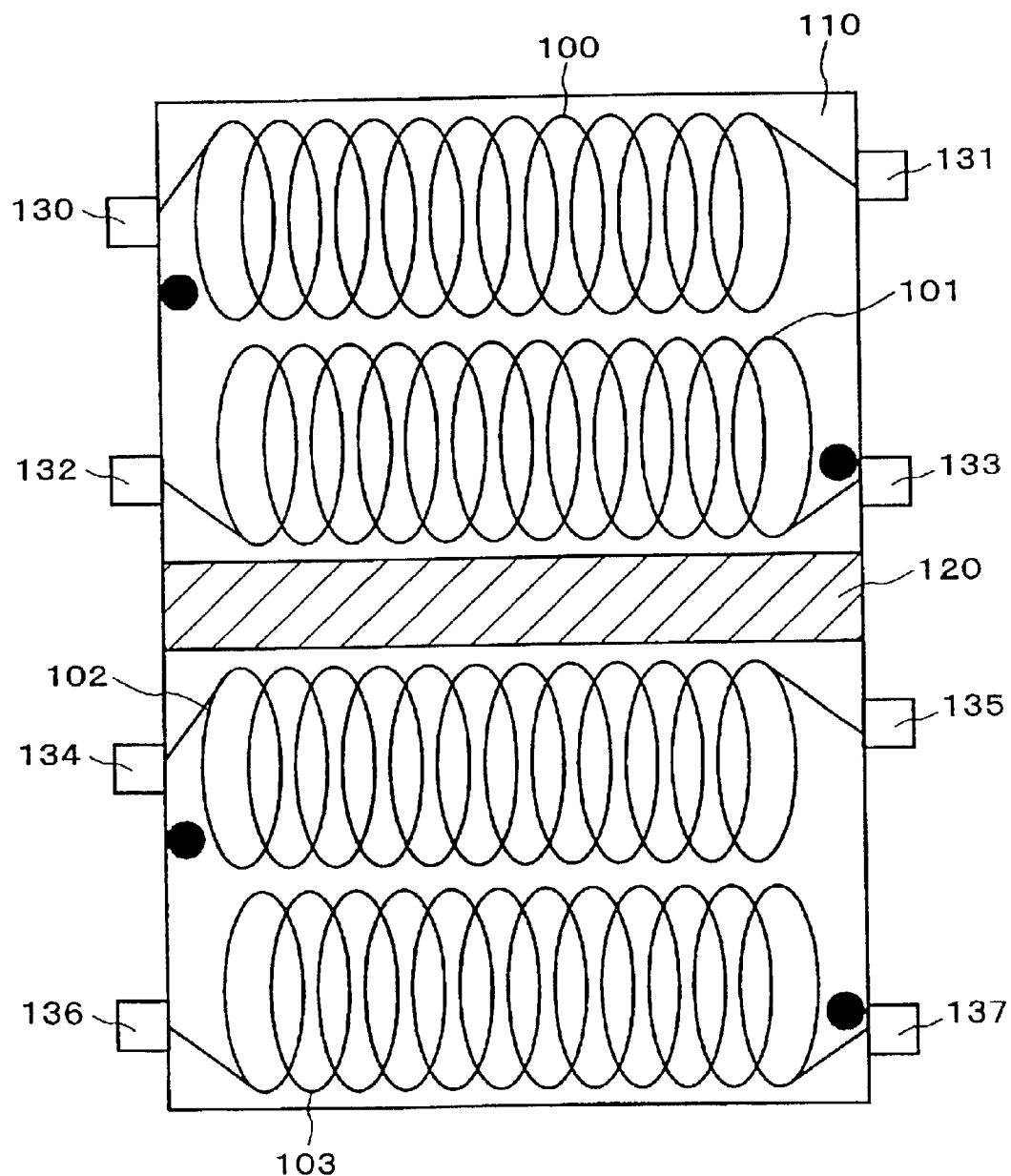
FIG. 5 diagrammatically shows the layout of coils incorporated in a filter coil for use in low-pass filters connected with BTL outputs of the class-D amplifier in accordance with a second embodiment of the invention.

Next, a description will be given with respect to a filter coil in accordance with the second embodiment of the invention with reference to FIG. 5. That is, the filter coil of the second embodiment provides coils that constitute low-pass filters for eliminating carrier frequency components in BTL outputs of a class-D amplifier.

Specifically, a pair of coils 100 and 101, each having the same inductance, which differ from each other in winding directions are arranged to adjoin together along axial directions thereof in a package 110. Ends of the coil 100 are connected with terminals 130 and 131, and ends of the coil 101 are connected with terminals 132 and 133.

In addition, a pair of coils 102 and 103, each having the same inductance, which differ from each other in winding directions are arranged to adjoin together along axial directions thereof in the package 110. Ends of the coil 102 are connected with terminals 134 and 135, and ends of the coil 103 are connected with terminals 136 and 137. A magnetic shield 120 is arranged to provide a partition between the first pair of coils 101 and 102 and the second pair of coils 102 and 103.

Figure 1:
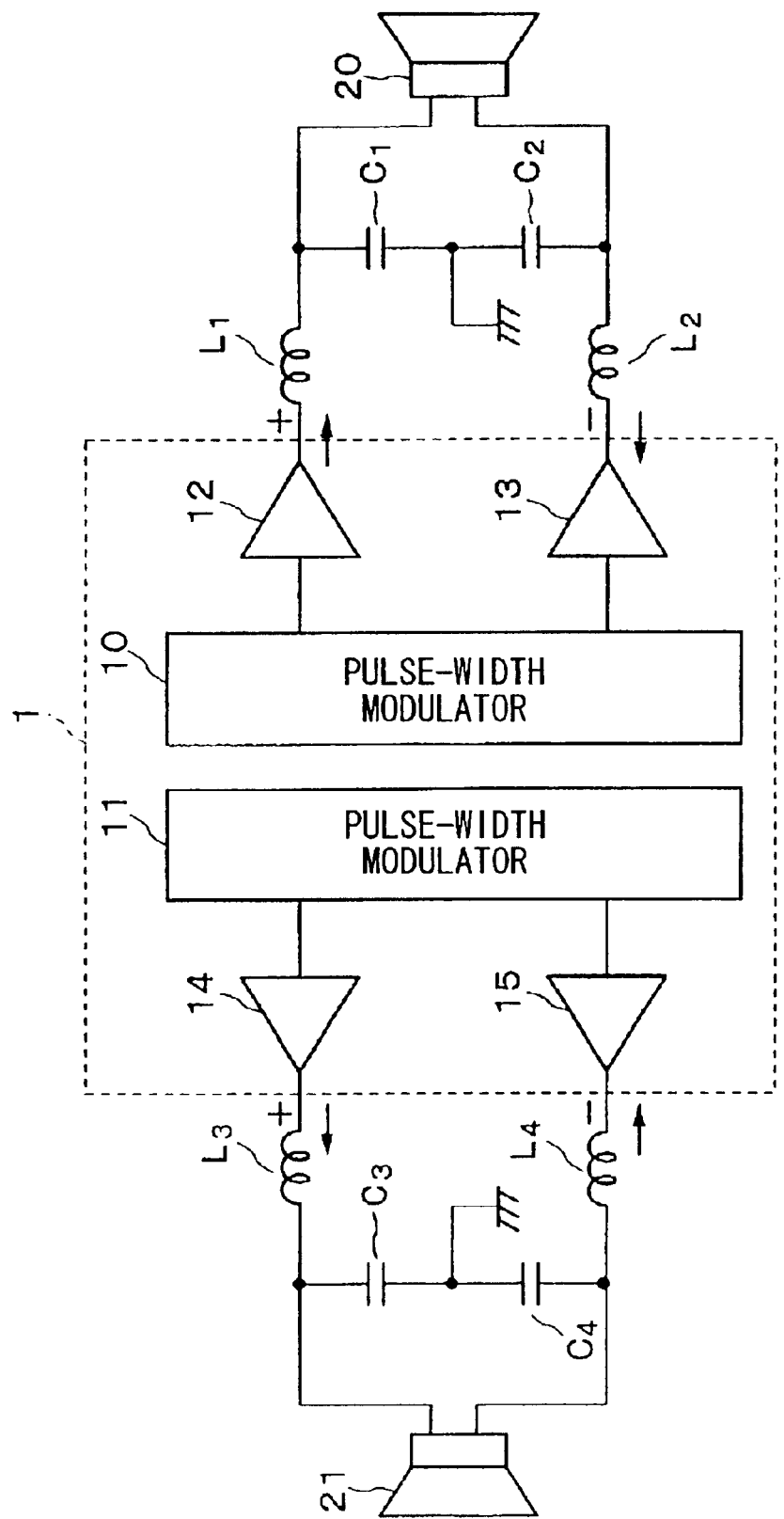
FIG. 1 is a line connection diagram showing the overall configuration of a class-D amplifier connected with speakers via low-pass filters.

The aforementioned four coils 100 to 103 can be respectively used as the four inductors L1 to L4 for use in low-pass filters connected with BTL outputs of the class-D amplifier 1 shown in FIG. 1. That is, the coil 100 is used as the inductor L1, the coil 101 is used as the inductor L2, the coil 102 is used as the inductor L3, and the coil 103 is used as the inductor L4.

The terminal 130 connected with one end of the coil 100 is connected to the output terminal of the driver 12, and the terminal 131 connected with the other end of the coil 100 is connected to one input terminal of the speaker 20. In addition, the terminal 132 connected with one end of the coil 101 is connected to the output terminal of the driver 13, and the terminal 133 connected with the other end of the coil 101 is connected to the other input terminal of the speaker 20.

Similarly, the terminal 134 connected with one end of the coil 102 is connected to the output terminal of the driver 14, and the terminal 135 connected with the other end of the coil 100 is connected to one input terminal of the speaker 21. In addition, the terminal 136 connected with one end of the coil 103 is connected to the output terminal of the driver 15, and the terminal 137 connected with the other end of the coil 103 is connected to the other input terminal of the speaker 21.

After completion of the aforementioned connections, the class-D amplifier 1 is started in operation in FIG. 1. In the filter coil of FIG. 5, the first pair of coils 100 and 101 produce magnetic fluxes in opposite directions, realizing cancellation of magnetic fluxes therebetween. Therefore, it is possible to reliably suppress the inductive coupling between the coils 100 and 101.

Similarly, the second pair of coils 102 and 103 produce magnetic fluxes in opposite directions, realizing cancellation of magnetic fluxes therebetween. Therefore, it is possible to reliably suppress the inductive coupling between the coils 102 and 103.

According to the arrangement of the magnetic shield 120, it is possible to suppress inductive coupling, which may occur between adjacent pairs of coils in the filter coil.

For the sake of the convenience, two pairs of coils are stored in a single package 110, wherein a pair of coils that differ from each other in winding directions is used as a single unit of coils. However, it is possible to incorporate plural units of coils into a single package, wherein a magnetic shield is arranged between adjacent units of coils.

In short, the filter coil of the second embodiment incorporates the prescribed number of pairs of coils that are arranged to adjoin together along axial directions with intervention of a magnetic shield therebetween, wherein each pair of coils, each having the same inductance, differ from each other in winding directions. Therefore, it is possible to further avoid occurrence of inductive coupling between the adjacent pairs of coils in the second embodiment compared with the first embodiment.

Figure 6:
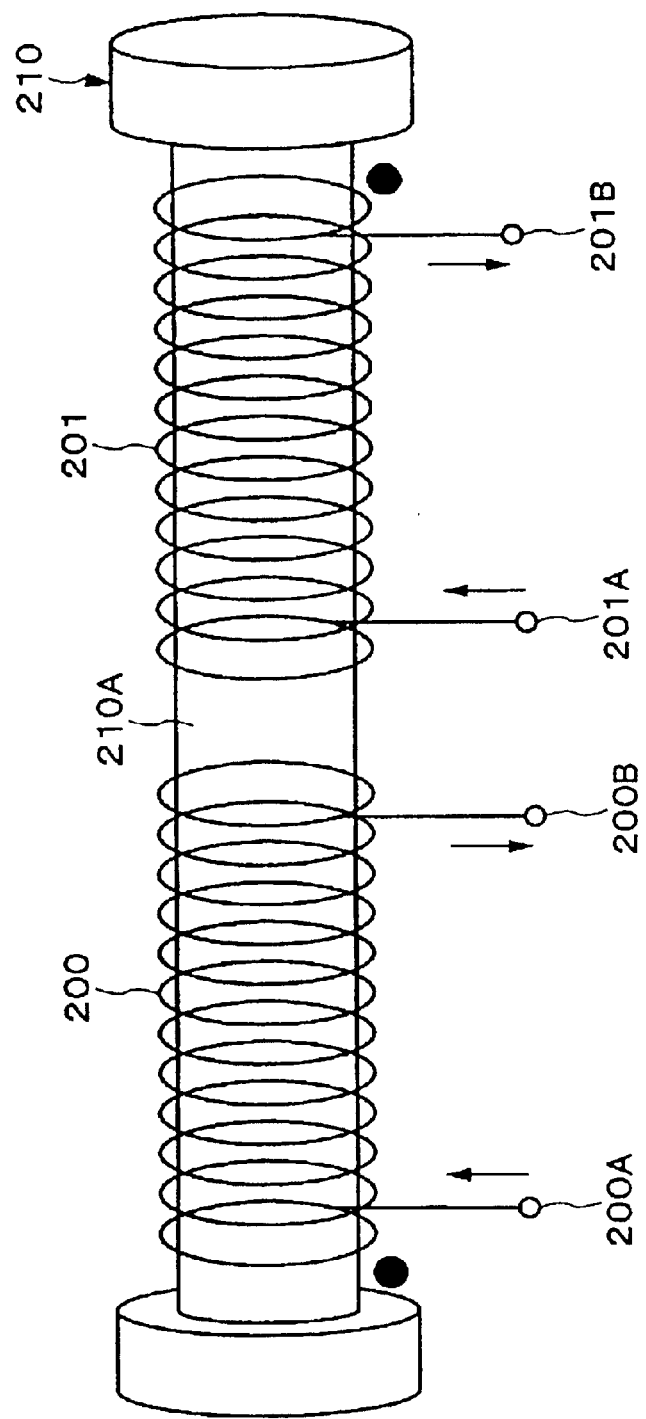
FIG. 6 diagrammatically shows the layout of coils incorporated in a filter coil for use in low-pass filters connected with BTL outputs of the class-D amplifier in accordance with a third embodiment of the invention.

Next, a filter coil of the third embodiment of the invention will be described with reference to FIG. 6. The filter coil of the third embodiment incorporates coils for use in low-pass filters for eliminating carrier frequency components in BTL outputs of the class-D amplifier. In FIG. 6, a pair of coils 200 and 201, each having the same inductance, which differ from each other in winding directions are respectively wound about a core 210A of a bobbin 210 along its axial direction.

For the sake of the convenience, FIG. 6 shows only a single pair of coils 200 and 201 wound about the core 210A of the bobbin 210. Of course, it is possible to arrange plural pairs of coils wound about the core 210A of the bobbin 210.

Suppose that the coils 200 and 201 contained in the filter coil of FIG. 6 are used as the inductors L1 and L2 for use in the two low-pass filters connected with BTL outputs of the class-D amplifier 1 shown in FIG. 1. In this case, a first terminal 200A of the coil 200 is connected to the output terminal of the driver 12, and a second terminal 200B is connected to the first input terminal of the speaker 20. In addition, a first terminal 201A of the coil 201 is connected to the output terminal of the driver 13, and a second terminal 201B is connected to the second input terminal of the speaker 20. After completion of the aforementioned connection, when the class-D amplifier 1 starts operation, the aforementioned coils 200 and 201 operate similarly to the foregoing coils used in the foregoing embodiments; hence, the detailed description thereof will be omitted.

The third embodiment is characterized in that a pair of coils 200 and 201, each having the same inductance, which differ from each other in winding directions are respectively wound about a single core 210A of the bobbin 210 along its axial direction. Therefore, it is possible to realize reduction of installed areas of coils and reduction of the cost in manufacture of filter coils incorporating coils for use in low-pass filters connected with BTL outputs of class-D amplifiers.

It was described before that the positive polarity output and negative polarity output in BTL outputs of a class-D amplifier both have the same magnitude (or amplitude) but differ from each other in phases by 180°. Hence, a pair of coils 200 and 201 of the filter coil of the third embodiment produce magnetic fluxes in opposite directions, realizing cancellation of magnetic fluxes and prevention of inductive coupling therebetween. In addition, the third embodiment eliminates the necessity of crossing external lines of coils in substrate wiring. Thus, it is possible to avoid occurrence of unwanted radiation, which may occur due to complication of substrate wiring.

Figure 7:
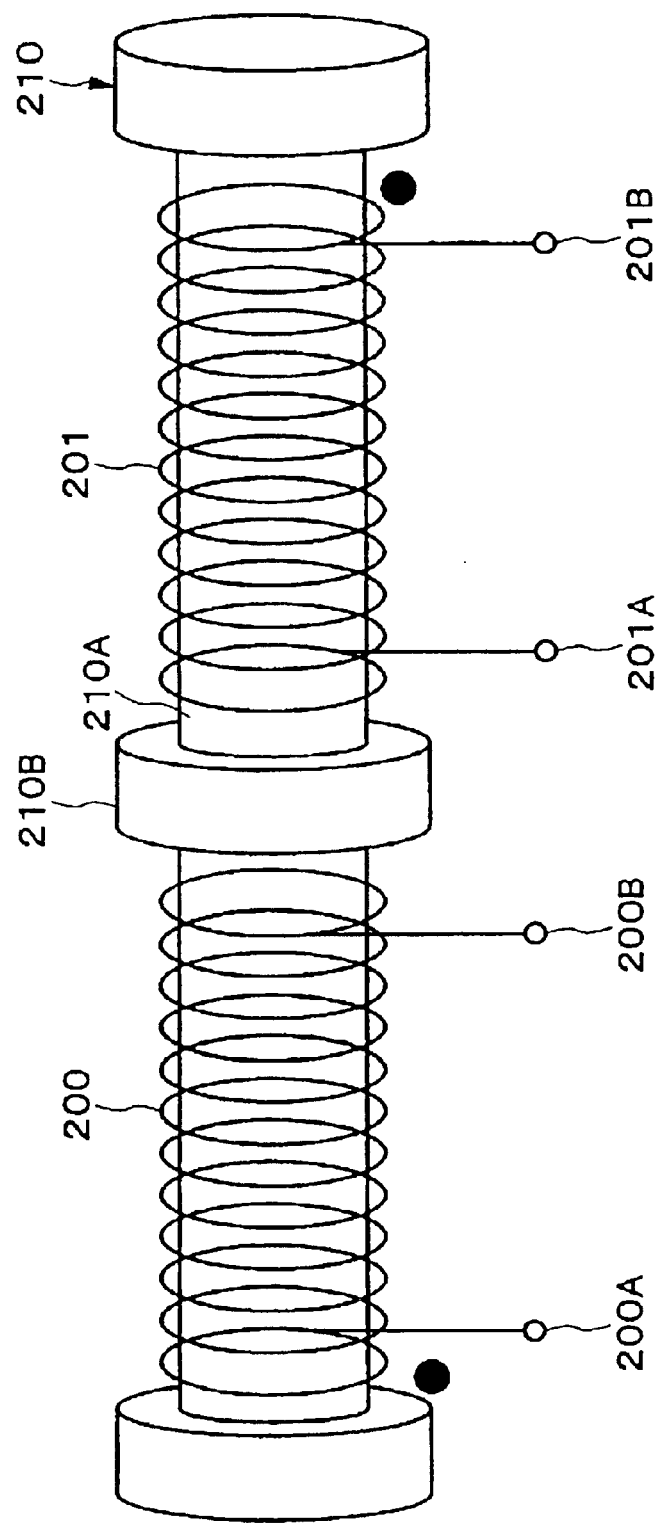
FIG. 7 diagrammatically shows the layout of coils incorporated in a filter coil for use in low-pass filters connected with BTL outputs of the class-D amplifier in accordance with a fourth embodiment of the invention.

Next, a filter coil of the fourth embodiment of the invention will be described with reference to FIG. 7. Compared with the aforementioned filter coil of the third embodiment of FIG. 6, the filter coil of the fourth embodiment of FIG. 7 is characterized in that a magnetic shield 210B is arranged between the coils 200 and 201, each having the same inductance, which differ from each other in winding directions and are respectively wound about the core 210A of the bobbin 210. Hence, the duplicate description between the third and fourth embodiments will be omitted as necessary.

The fourth embodiment provides the magnetic shield 210B at the boundary between the coils 200 and 201, each having the same inductance, which differ from each other in winding directions. Of course, the magnetic shield is not necessarily arranged between adjacent coils wound about the same core of the bobbin. That is, when plural pairs of coils are respectively wound about the core of the bobbin, a magnetic shield is arranged between adjacent pairs of coils wound about the core of the bobbin.

In the filter core of the fourth embodiment in which at least a pair of coils, each having the same inductance, which differ from each other in winding directions, are respectively wound about the core of the bobbin along its axial direction with intervention of a magnetic shield therebetween. Thus, it is possible to effectively suppress inductive coupling between adjacent coils (or adjacent pairs of coils).

As described heretofore, when the filer coils incorporating coils are used for low-pass filters for eliminating carrier frequency components in BTL outputs of class-D amplifiers in accordance with the aforementioned embodiments, it is possible to realize reduction of installed areas of coils for use in low-pass filters and reduction of the cost in manufacture of filter coils as well as prevention of unwanted radiation.

In addition, it is possible to realize reduction of the manufacturing cost as well as reduction of the overall size and dimensions with respect to class-D amplifiers of BTL output types, which are followed by low-pass filters using filter coils in accordance with the aforementioned embodiments. Further, it is possible to reliably avoid occurrence of unwanted radiation, which may occur due to complicated wiring of external lines of coils of low-pass filters for eliminating carrier frequency components of BTL outputs of class-D amplifiers.

As described heretofore, this invention has a variety of effects and technical features, which will be described below.

(1) The filter coil of this invention incorporates plural coils, each having the same inductance, which differ from each other in winding directions and are arranged to adjoin together along axial directions thereof in a single package. Therefore, it is possible to realize reduction of installed areas of coils and reduction of the cost in manufacture of filter coils for use in low-pass filters connected with BTL outputs of class-D amplifiers.

(2) The filter coil of this invention can include plural pairs of coils that are arranged to adjoin together along axial directions thereof in a single package, wherein each pair contains two coils, each having the same inductance, that differ from each other in winding directions.

(3) The positive polarity output and negative polarity output in BTL outputs of a class-D amplifier both have the same magnitude (or amplitude) but differ from each other in phases by 180°. Herein, the class-D amplifier is followed by low-pass filters using filter coils, wherein one pair of coils, which differ from each other in winding directions, produce magnetic fluxes in opposite directions, thus realizing cancellation of magnetic fluxes and prevention of inductive coupling therebetween. Therefore, it is possible to eliminate the necessity of crossing external lines of coils in substrate wiring, which is required in the foregoing common-mode coil containing coils both having the same winding direction. Thus, it is possible to reliably avoid occurrence of unwanted radiation, which may occur due to complication of substrate wiring.

(4) When plural pairs of the aforementioned coils, each having the same inductance, which differ from each other in winding directions, are arranged to adjoin together along axial directions thereof in a single package, it is possible to avoid occurrence of inductive coupling between adjacent pairs of coils.

(5) A pair of coils, each having the same inductance, which differ from each other in winding directions are respectively wound about a single core along its axial direction. In addition, it is possible to arrange plural pairs of coils wound about a single core along its axial direction. Thus, it is possible to realize reduction of installed areas of coils and reduction of the cost in manufacture of filter coils.

(6) In the above, it is possible to arrange paired coils wound about a single core with intervention of a magnetic shield therebetween. Alternatively, it is possible to arranged plural pairs of coils respectively wound about a single core with intervention of a magnetic shield therebetween. Thus, it is possible to effectively suppress inductive coupling between the adjacent coils or between the adjacent pairs of coils.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A filter coil, comprising:

at least a pair of coils, each of the pair of coils having equal inductance, which differ from each other in winding directions and are arranged adjacent to each other along axial directions thereof in a single package, said coils being used for low-pass filters for eliminating carrier frequency components in Bridged Tied Load outputs of a class-D amplifier, wherein a winding start portion of a first coil of the at least the pair of coils and a winding end portion of a second coil of the at least the pair of coils are respectively connected with terminals arranged at a same side of the single package.

2. A filter coil, comprising:

a plurality of pairs of coils that are arranged adjacent to each other along axial directions thereof in a single package, wherein each pair of coils consists of a first coil and a second coil, each having equal inductance, each of the first coil and the second coil differing from each other in winding directions and being used for low-pass filters for eliminating frequency components in Bridged Tied Load outputs of a class-D amplifier, wherein a winding start portion of the first coil and a winding end portion of the second coil are respectively connected with terminals arranged at a same side of a single package.

3. A filter coil incorporating plural pairs of coils that are arranged adjacent to each other along axial directions thereof in a single package, wherein each pair consists of two coils each having equal inductance that differ from each other in winding directions and are used for low-pass filters for eliminating frequency components in Bridged Tied Load outputs of a class-D amplifier, and wherein a magnetic shield is arranged between adjacent pairs of the coils.

4. A filter coil, comprising:

at least a pair of coils, each having equal inductance, which differ from each other in winding directions and are respectively wound about a single core along its axial direction, wherein the coils are used for low-pass filters for eliminating carrier frequency components in Bridged Tied Load outputs of a class-D amplifier, wherein a winding start portion of a first coil and winding end portion of a second coil within the at least the pair of coils are respectively connected with terminals arranged at the same side of a single package.

5. A filter coil incorporating at least a pair of coils, each coil within the pair of coils having equal inductance, which differ from each other in winding directions and are respectively wound about a single core along its axial direction, wherein the coils are used for low-pass filters for eliminating carrier frequency components in Bridged Tied Load outputs of a class-D amplifier, wherein a magnetic shield is arranged between adjacent coils.

6. A class-D amplifier of a Bridged Tied Load output type, comprising:

a pulse-width modulator for producing pulse-width modulated signals in response to input signals;

a first driver for amplifying the pulse-width modulated signals with a first polarity;

a second driver for amplifying the pulse-width modulated signals with a second polarity;

a first low-pass filter coupled to the first driver to drive a load with the first polarity; and a second low-pass filter coupled to the second driver to drive the load with the second polarity, wherein the first low-pass filter having a first coil and the second low-pass filter having a second coil, each of the first coil and the second coil having equal inductance, differing from each other in winding directions and being arranged adjacent to each other along axial directions thereof in a single package, wherein a winding start portion of the first coil and a winding end portion of the second coil of the coils are respectively connected with terminals arranged at the same side of the single package.

7. A class-D amplifier according to claim 6, wherein the first coil and the second coil have equal inductance, which differ from each other in winding directions and are respectively wound about a single core along its axial direction in a single package.

8. A class-D amplifier of a Bridged Tied Load output type, comprising:

a pulse-width modulator for producing pulse-width modulated signals in response to input signals;

a first driver for amplifying the pulse-width modulated signals with a first polarity;

a second driver for amplifying the pulse-width modulated signals with a second polarity;

a first low-pass filter coupled to the first driver to drive a load with the first polarity; and a second low-pass filter coupled to the second driver to drive the load with the second polarity, wherein the first and second low-pass filters contain coils, each coil having equal inductance, differing from each other in winding directions and being arranged adjacent to each other along axial directions thereof in a single package, wherein a magnetic shield is interposed between the adjacent coils.

9. A class-D amplifier of a Bridged Tied Load output type, comprising:

a pulse-width modulator for producing pulse-width modulated signals in response to input signals;

a first driver for amplifying the pulse-width modulated signals with a first polarity;

a second driver for amplifying the pulse-width modulated signals with a second polarity;

a first low-pass filter coupled to the first driver to drive a load with the first polarity; and a second low-pass filter coupled to the second driver to drive the load with the second polarity, wherein the first and second low-pass filters contain coils, each coil having equal inductance, which differ from each other in winding directions and are arranged adjacent to each other along axial directions thereof in a single package and are respectively wound about a single core along the axial direction in the single package, and, wherein a magnetic shield is interposed between the adjacent coils.

* * * * *